United States Patent [19]

Cross et al.

[11] 4,027,074
[45] May 31, 1977

[54] PROCESS FOR PRODUCING FERROELECTRIC CRYSTALLINE MATERIAL

[75] Inventors: Leslie E. Cross; Raymond J. Kunz; Robert E. Newnham, all of State College, Pa.

[73] Assignee: Leco Corporation, St. Joseph, Mich.

[22] Filed: Aug. 19, 1974

[21] Appl. No.: 498,695

[52] U.S. Cl. .............................. 428/450; 252/62.9; 423/326; 423/593; 427/47; 427/93; 427/126; 427/128; 427/130; 428/469; 428/539

[51] Int. Cl.$^2$ .................... C01G 17/00; B32B 9/00

[58] Field of Search ............ 423/593, 326; 427/47, 427/93, 126, 128, 130; 252/62.9; 106/39.6; 428/450, 469, 539

[56] References Cited

UNITED STATES PATENTS

| | | | |
|---|---|---|---|
| 3,193,503 | 7/1965 | Smith | 106/39.6 |
| 3,243,335 | 3/1966 | Faile | 106/39.6 |
| 3,694,360 | 9/1972 | Weaver | 106/39.6 |

OTHER PUBLICATIONS

Iwasaki et al., "Journal Applied Physics," vol. 43, Dec. 1972, pp. 4907–4915.

Primary Examiner—Herbert T. Carter
Attorney, Agent, or Firm—Price, Heneveld, Huizenga & Cooper

[57] ABSTRACT

Lead germanate, $Pb_5Ge_3O_{11}$, or lead germanate/silicate in which up to 2/3 on a molar basis of the germanium has been substituted with silicon, can be formed from a glassy state to a ferroelectric state by a simple annealing process. The lead germanate or lead germanate/silicate is heated to a temperature sufficient to anneal it into a crystalline phase, then cooled below the ferroelectric transition temperature for the composition while an electric field is applied.

6 Claims, 1 Drawing Figure

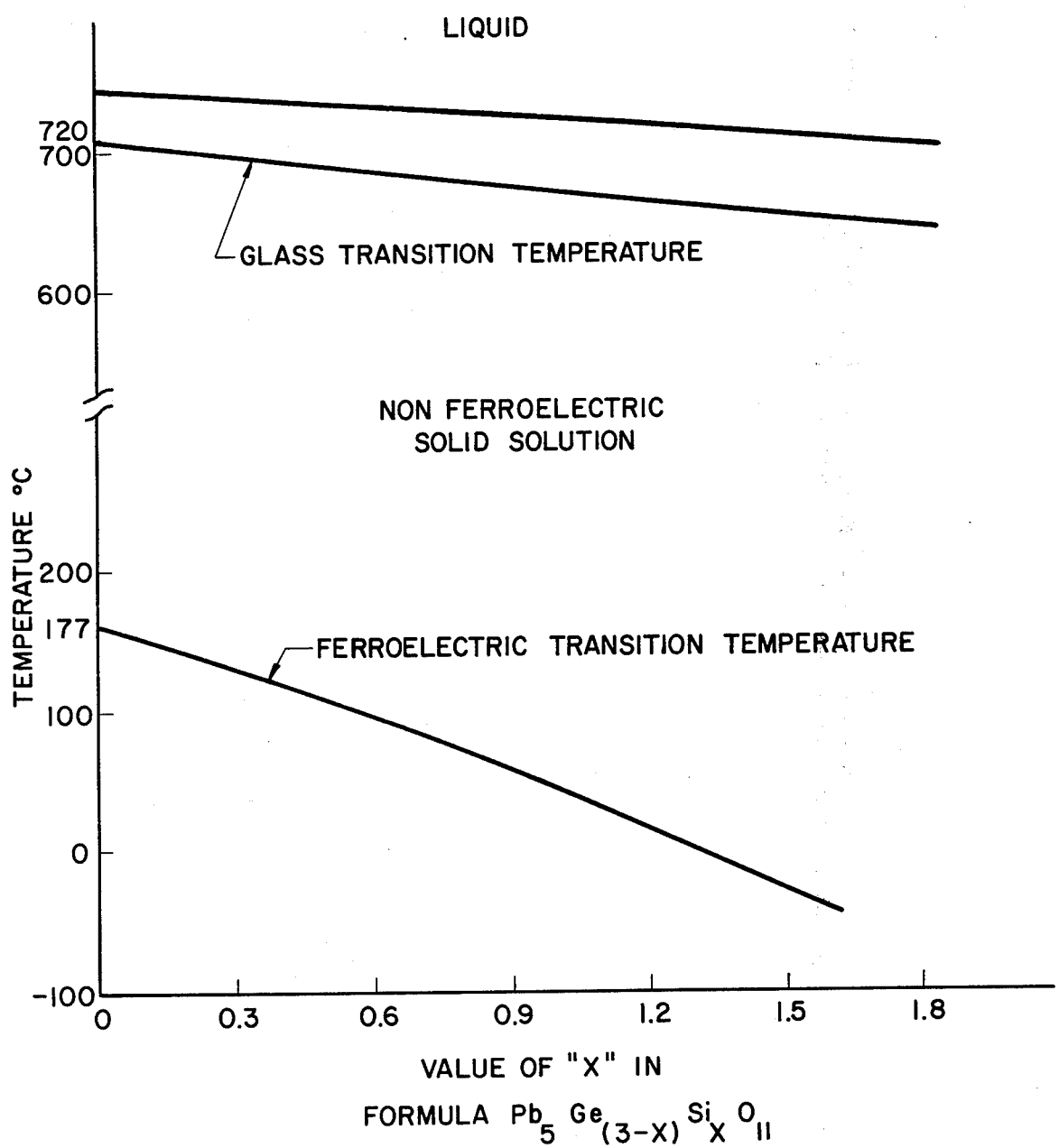

PROCESS FOR PRODUCING FERROELECTRIC CRYSTALLINE MATERIAL

BACKGROUND OF THE INVENTION

The fabrication of conventional ferroelectric devices usually requires a preliminary fabrication of large, single crystal sheets of ferroelectric material. This is particularly the case in the case of infrared detectors which require a large surface area of ferroelectric material as the infrared detection element. In recent years, much research has been devoted to finding new forms of systems which alleviate the problems associated with producing large detector areas. Substantial development work has been dedicated to polymer systems which allow one to fabricate detector materials in an expandable large area film.

At present, there is insufficient processing data or evidence that these polymer systems are in fact a true ferroelectric material. In addition, the processing is highly dependent on the mechanical conditions that these films have experienced, and the end result is grossly dependent on the particular forms of processing used and on the storage conditions to which the material is later exposed. Thus, though they are promising in themselves, a polymer system does not appear to be the ideal system for use for large area ferroelectric detectors.

It is, therefore, an object of this invention to provide a new process for producing a ferroelectric crystalline material, which is subject to fabrication of large single crystal sheets. A further object of the invention is to provide a process for producing a ferroelectric crystalline material which can be produced in situ on a conductive substrate such as gold.

SUMMARY OF THE INVENTION

In accordance with this invention, there is provided a process for producing a ferroelectric crystalline material, comprising the steps of (1) forming a mass of a material having the formula $PbGe_{(3-x)}Si_xO_{11}$, wherein the value of $x$ is between 0 and 2, in a glassy state; (2) heating the glassy mass to a temperature between about 450° C and the glass transition temperature of the composition (which ranges from about 720° C, when $x$ is 0, to about 640° C when $x$ is 2), to anneal the glassy mass into a crystalline mass; and (3) cooling the annealed mass to a temperature below the ferroelectric transition temperature of the composition (which ranges from about 177° C, where $x$ is 0, to about −100° C, where $x$ is 2), to form a ferroelectric mass. Compositions in which $x$ is 0 or close to 0 are preferred, as increasing the value of $x$ (increasing the silicon content of the composition) lowers the melting point, the ferroelectric transition temperature, and the coercive field of the composition. It is preferred to have a high ferroelectric transition temperature, in order to make an easier transition from the non-ferroelectric crystalline mass to the ferroelectric mass, and to provide a more stable ferroelectric material. The present invention allows a major part of the processing of the ferroelectric material to be done while the material is in the form of a glass, and one therefore need not be concerned with loss of ferroelectric properties while processing. One can thus make use of all of the ancient and modern arts used in glass forming, such as blowing, production of films, rolling, and the like.

BRIEF DESCRIPTION OF THE DRAWING

The single FIGURE of drawing is a phase diagram of the lead germanate/silicate material to which the present invention relates.

DETAILED DESCRIPTION

Referring now to the drawing, the composition of lead germanate/silicate is indicated at the bottom of abscissa of the FIGURE. The extreme left-hand of the drawing FIGURE represents the material $Pb_5Ge_3O_{11}$, i.e., pure lead germanate with no silicon substitution. Moving to the right-hand side of the phase diagram by increasing the amount of silicon substituted for germanium is indicated by increasing values of $x$ in the formula $Pb_5Ge_{(3-x)}Si_xO_{11}$.

In accordance with the present invention, the first step of producing a ferroelectric crystalline material is forming a mass having the desired composition in a glassy state. This is preferably accomplished by casting the material on the surface of a semiconductive or conductive substrate, such as gold, which is ultimately to serve as the conductor for activation of the ferroelectric device (e.g., infrared radiation detector) which is to make use of the ferroelectric crystalline material. Formation of the glass at room temperature is no problem, since the desired glassy composition can be produced in accordance with conventional technology from lead oxide, PbO; germanium oxide $GeO_2$; and silica, $SiO_2$. The desired materials (PbO, $GeO_2$ and $SiO_2$) are mixed together in the desired proportion, melted and cast onto the conductive substrate sufficiently fast that the material does not crystallize. The material can be cast into a large sheet without concerning oneself with the problem of forming a single crystal, or arranging the crystalline material in the proper orientation. This formation in a glassy state should be done so that the glassy mass of lead germanate or lead germanate/silicate has the physical size which is ultimately desired for a ferroelectric element to be used in another system.

After the glass is formed, the glassy mass is heated to a temperature between about 450° C and the glass transition temperature of the composition. This glass transition temperature is shown in the phase diagram as the slanting line sloping from 720° C at the left-hand side of the drawing for pure lead germanate, down to about 640° C for the composition in which two-thirds of the germanium has been substituted with silicon. The composition is then held at the annealing temperature for a time sufficient to transform the glassy mass into a crystalline phase. The time required will vary with the composition, the annealing temperature and the size and orientation of crystallites required for the final application for which the ferroelectric crystalline material is desired.

After the glassy mass is transformed into a crystalline mass, it is cooled while applying an electric field of about 15 to about 30 kilovolts/centimeter, to a temperature below the ferroelectric transition temperature. This ferroelectric transition temperature is shown in the graph in the line sloping from 177° C at pure lead germanate, to about −100° C for the composition in which two-thirds of the germanium has been substituted with silica. It is found that when the crystalline mass is cooled below the ferroelectric transition temperature with an applied electric field, perpendicular to the substrate upon which the lead germanate or lead germanate/silicate material is situated, that the ferroelectric axis produced in the material is perpendicular to the substrate, a desired condition for many practical applications of ferroelectric materials.

It is preferred that compositions having a small quantity (or none at all) of the germanium substituted with silicon be used in the present invention, since these materials have a higher ferroelectric transition temperature, so that (1) it is easier to transform the nonferroelectric glassy material into the ferroelectric form, and (2) once formed, the ferroelectric material has a higher transition temperature, so that it is more stable to temperature variations, and will not accidentally become transformed from the ferroelectric state into the nonferroelectric state.

Accordingly, one preferred embodiment of the present invention utilizes pure lead germanate, with no silicon substitution. The temperature of annealing can then be varied between about 450° and 720° C; and the ferroelectric transition temperature below which the annealed material is to be cooled, after annealing, is 177° C.

It is believed that this lead germanate/silicate system is the first system to be directly convertible in situ from a glassy nonferroelectric state to a crystalline ferroelectric form, without any additional nonferroelectric phases being present in the final polycrystal. The material can thus be formed into thin sheets on the surface of a semiconductive or conductive substrate such as gold, silicon, germanium, or mixtures thereof. A gold substrate is preferred.

The invention will now be illustrated with examples.

EXAMPLE 1

Thin film fabrication of polycrystalline lead germanate, $Pb_5Ge_3O_{11}$, was accomplished by a slightly modified float glass technique. An alumina crucible was partially filled with a tin-gold alloy of composition which is molten at 600° C, with a density in the liquid form higher than the density of $Pb_5Ge_3O_{11}$.

The crucible was heated in a simple electric furnace to a temperature above 750° C. A small quantity of pre-reacted $Pb_5Ge_3O_{11}$ is deposited on the molten metal surface in the crucible. The $Pb_5Ge_3O_{11}$ melts, running out over the metal surface to form a thin coherent film where thickness may be controlled by the weight of germanate use.

After the liquid $Pb_5Ge_3O_{11}$ film has formed, the temperature of the gold-tin metal is rapidly lowered to 700° C. At this point the alloy is still liquid but a thin polycrystalline germanate film has formed on the metal. This germanate film was lifted from the surface by a metal spatula. X-ray examination proved the structure to be that of ferroelectric germanate $Pb_5Ge_3O_{11}$. Also the powder pictures showed a strong preferred orientation for crystal film as would be required in the ferroelectric device.

EXAMPLE 2

Lead Germanate Glass Ceramic Detector.

Lead oxide (PbO) of technical grade and high purity germanium oxide ($GeO_2$) were weighed out in stoichiometric proportions for the reaction:

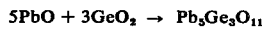

$5PbO + 3GeO_2 \rightarrow Pb_5Ge_3O_{11}$

The smaller 25 gm batch was heated in air in a gold boat to a temperature of 840° C at which the melt was completely liquid. A small quantity was then poured onto a thin gold foil maintained at a temperature of 740° C. The foil was then rapidly cooled (quenched) by cooling from the upper surface to a temperature of 600° C and the surface observed through a low power microscope.

In this temperature region, the $Pb_5Ge_3O_{11}$ is a glassy solid, but crystals of the ordered form begin to appear at a few isolated centers. By careful control of the cooling rate and temperature profile a few of the larger nuclei were grown up into thin single crystal sheets with the ferroelectric c axis normal to the plane of the glass sheet.

For evaluation of the pyroelectric performance, the gold foil of the support was used as counter electrode, and a thin gold film evaporated onto the upper surface formed the measuring electrode.

To pole the glass ceramic, the sample was heated to 100° C in silicone oil, and cooled under an alternating field at 12 KV/cm. The ferroelectric phenomenon being checked on a Sawyer and Tower display to verify opening of a square hysteresis loop. After A.C. poling the capacitor was then DC poled by a field of 20 KV/cm applied for 12 hours at room temperature.

For evaluation of the responsivity the capacitor was mounted in a standard head unit (model LCP-1284 amplifier housing, manufactured by the Tem-Pres Division of The Carborundum Company, State College, Pennsylvania, U.S.A.), with a parallel resistor of $10_{11}$ ohms and a conventional emitter follower amplifier. An Epply standard black body radiator was used as the thermal source, and for responsivity measurements this was chopped at 13.8 Hz using a mechanical chopper.

The output voltage was monitored on a Princeton Applied Research lock-in amplifier tuned to 13.8 Hz and phase locked to the chopping disc.

To verify the calibration of the optical bench and power source, the responsivity of a standard triglycine sulfate single crystal detector (a standard ferroelectric detector material) was measured using identical electronics. The $Pb_5Ge_3O_{11}$ detector was found to have a sensitivity comparable to the triglycine sulfate material, which is much more difficult to fabricate.

EXAMPLE 3

Lead Germanate Silicate.

Example 2 was repeated, for a composition corresponding to the formula $Pb_5Ge_2SiO_{11}$. Apart from the added silica, processing conditions and measurement procedures were identical. The $Pb_5Ge_2SiO_{11}$ detector was again found to have a sensitivity comparable to the much less easily fabricated triglycine sulfate material.

We claim:

1. A process for producing a ferroelectric crystalline element, comprising the steps of:
    1. forming a mass having the formula $Pb_5Ge_{(3-x)}Si_xO_{11}$, wherein x ranges from 0–2, in a glassy state;
    2. heating said mass to a temperature between about 450° C and the glass transition temperature of the composition to anneal the glassy mass into a crystalline mass; and
    3. cooling the annealed mass while applying an electric field of about 15 to about 30 kilovolts/centimeter to a temperature below the ferroelectric transition temperature of the composition, to form a ferroelectric crystalline mass.

2. A process of claim 1, wherein the value of x is 0; wherein the temperature of annealing is between about 450° C and 720° C; and the annealed mass is cooled below a ferroelectric transition temperature of about 177° C.

3. A process according to claim 1, wherein the operations of heating and cooling while applying an electric field are carried out with the mass situated on the surface of a conductive or semiconductive substrate.

4. A ferroelectric crystalline element formed by the process in claim 3.

5. A process according to claim 3, wherein said substrate is selected from the group consisting of gold, silicon, germanium, and mixtures thereof.

6. A process according to claim 3, wherein said conductive substrate is gold.

* * * * *